United States Patent
Leeson et al.

(10) Patent No.: US 6,870,746 B2
(45) Date of Patent: Mar. 22, 2005

(54) ELECTRONIC MODULE

(75) Inventors: Kim Leeson, Ipswich (GB); Keith Everett, Bury St Edmunds (GB)

(73) Assignee: Agilent Technologies, Inc., Palo Alto, CA (US)

(*) Notice: Subject to any disclaimer, the term of this patent is extended or adjusted under 35 U.S.C. 154(b) by 66 days.

(21) Appl. No.: 10/288,803

(22) Filed: Nov. 6, 2002

(65) Prior Publication Data

US 2004/0085744 A1 May 6, 2004

(51) Int. Cl.[7] .................................................. H05K 9/00
(52) U.S. Cl. ........................ 361/816; 361/818; 361/800; 361/801; 439/609; 439/487
(58) Field of Search ................................. 361/816, 818, 361/727, 728, 730, 736, 752, 753, 796, 704, 799–802, 707, 710, 715, 719, 720; 439/607, 609, 487, 923; 174/51, 35 C, 35 R

(56) References Cited

U.S. PATENT DOCUMENTS

| | | | | |
|---|---|---|---|---|
| 6,071,016 A | * | 6/2000 | Ichino et al. | 385/92 |
| 6,282,092 B1 | * | 8/2001 | Okamoto et al. | 361/704 |
| 6,290,540 B1 | * | 9/2001 | Nishio et al. | 439/607 |
| 6,459,517 B1 | * | 10/2002 | Duncan et al. | 398/139 |
| 6,508,595 B1 | * | 1/2003 | Chan et al. | 385/92 |
| 6,599,151 B2 | * | 7/2003 | Chiran et al. | 439/610 |

* cited by examiner

*Primary Examiner*—David Martin
*Assistant Examiner*—Thanh S. Phan

(57) ABSTRACT

An electronic module having a configuration for promoting efficient heat dissipation and a circuit board assembly are provided such that when the electronic module is inserted within the circuit board assembly a portion of the electronic module overlaps an EMI shield, with the portion of the electronic module having a configuration for promoting efficient heat dissipation and being external of the EMI shield.

9 Claims, 7 Drawing Sheets

ELECTRONIC MODULE

FIELD OF THE INVENTION

The present invention relates, in general, to an electronic module of a type having a configuration for promoting efficient heat dissipation and being engageable with an electromagnetic interference (EMI) shield for suppressing an emission of EMI arising from the operability of the module.

DISCUSSION OF THE BACKGROUND ART

In the field of optical communications, an electronic module can provide a so-called "Plug & Play" module comprising a number of components forming, for example, a transmitter module or a transceiver module designed to be easily installed and replaced within an optical communications system. Typically, such modules are provided with an optical connector at one end of the module, such as an Lucent Connector (LC) connector, for coupling to an optical communications network by way of an optical fibre having a complementary connector attached thereto; and at another end, an electronic assembly in the form of a printed circuit board for connecting the module to a surface mount connector such as one mounted upon a motherboard coupled to a Peripheral Component Interface (PCI) bracket.

Typically, a portion of the module is designed with a configuration for promoting efficient heat dissipation from the module whilst in operation. Such heat dissipation is necessary in order to prevent high temperatures occurring within the module which can cause damage to or inefficient operation of the components within the module.

It is known that EMI generated during the operation of the module and in particular EMI generated by electronic devices within integrated circuits (ICs) contained within the electronic assembly of the module must be regulated to meet electromagnetic compatibility (EMC) standards. EMI is a noise condition and in the field of ICs designed to handle multi-level signals (e.g. a binary signal), the primary source of EMI is associated with the edge rise and fall time of a digital signal as it switches between the binary levels. The steep edges and sharp corners of the digital signal correspond to high frequency energy for which regulatory requirements for EMC are hardest to meet.

It is known to suppress and thereby regulate generated EMI emissions using an assembly as illustrated in FIG. 1. Referring to FIG. 1, a side perspective of an opto-electronic module comprises a housing 10 having a lip portion 12 extending therefrom and substantially over a surface mount connector 16. An electronic assembly 14 such as a printed circuit board (PCB) is disposed within the housing 10 of the module and is coupled to the surface mount connector 16. The surface mount connector 16 is mounted upon a motherboard 18 coupled to a PCI bracket (not shown). An EMI shield 20, manufactured from stainless steel, contacts the outer surface of the housing 10 of the module and is also coupled to the motherboard 18.

Assembly of the apparatus is as follows. A rail assembly (not shown in FIG. 1) is provided upon the motherboard 18 around the surface mount connector 16 and the EMI shield 20 is fixed to the rail assembly above the surface mount connector 16 and also fixed to the motherboard 18. The module is then inserted within the rail assembly in order to connect the electronic assembly 14 to the surface mount connector 16 and in doing so the lip portion 12 of the housing 10 of the module slides under and engages with the EMI shield 20 by way of resilient fingers 22 projecting from the underside of the EMI shield 20. In operation of the module, any EMI emissions generated by electronic devices in the electronic assembly 14 or the surface mount connector 16 are contained within the EMI shield 20 so as to suppress and thereby regulate EMI emissions.

Where the EMI shield 20 and the lip portion 12 of the housing 10 overlap, the outer surface of the housing 10 cannot be designed with, for example, a plurality of fins to promote efficient heat dissipation because the EMI shield 20 would not engage the housing 10 effectively enough to suppress EMI emissions. Consequently, the dissipation of heat from this region of the apparatus is particularly inefficient. This is disadvantageous because this region of the assembly is above the surface mount connector 16 and the electronic assembly 14 which are both sources of heat when in operation.

SUMMARY OF THE INVENTION

According to a first aspect of the present invention, there is provided an electronic module comprising: a housing accommodating an electronic assembly, said housing having a configuration for promoting efficient heat dissipation and said electronic assembly being connectable to an electrical connector having an EMI shield adjacent thereof; wherein, when said electronic assembly is connected to said electrical connector, said housing and said EMI shield at least partially overlap with said housing being external of said EMI shield.

Preferably, said housing comprises a lip portion and a wall such that when said electronic assembly is connected to said electrical connector, said lip portion at least partially overlaps said EMI shield and said wall abuts said EMI shield. Preferably, said lip portion comprises a plurality of fins.

According to a second aspect of the present invention, there is provided a circuit board assembly comprising: an enclosure mounted upon a circuit board for receiving an electronic module comprising a housing accommodating an electronic assembly; an EMI shield disposed adjacent an electrical connector connectable to said electronic assembly, said electrical connector being disposed within said enclosure; wherein, when said electronic assembly is connected to said electrical connector, said housing and said EMI shield at least partially overlap with said housing being external of said EMI shield.

Preferably, said EMI shield comprises a plurality of projections trappable against said module. More preferably, said projections are resiliently biased.

According to a third aspect of the present invention, there is provided a system comprising an electronic assembly as described above and a circuit board assembly as described above.

BRIEF DESCRIPTION OF THE DRAWINGS

One embodiment of the present invention will now be described, by way of example only, with reference to the accompanying drawings, in which.

DETAILED DESCRIPTION OF THE PREFERRED EMBODIMENTS

Figure 1:
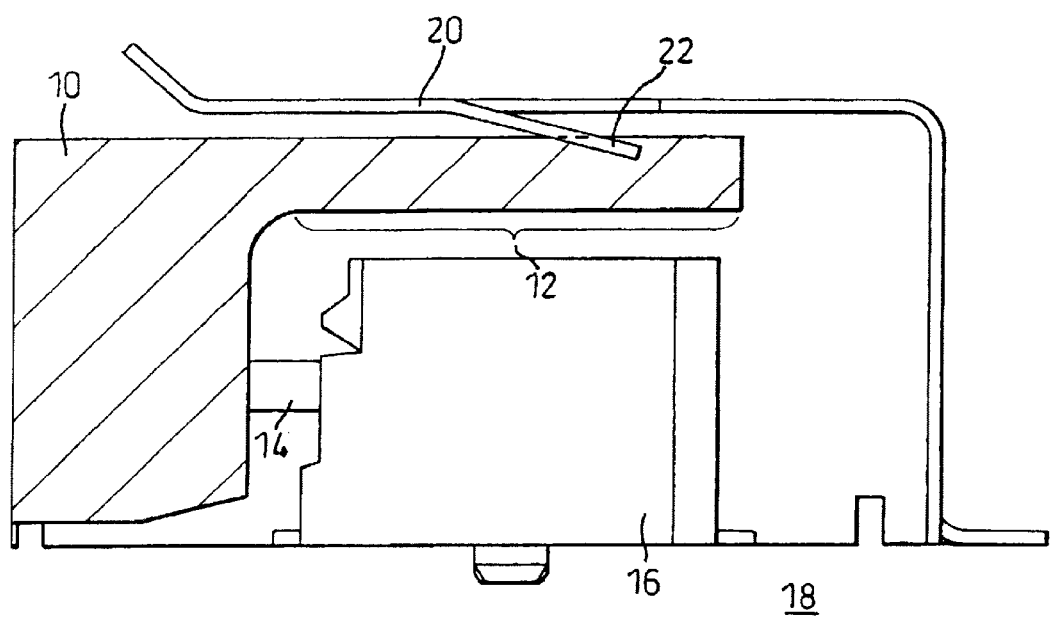
FIG. 1 is an illustration of a side perspective of an opto-electronic module.
Figure 2:
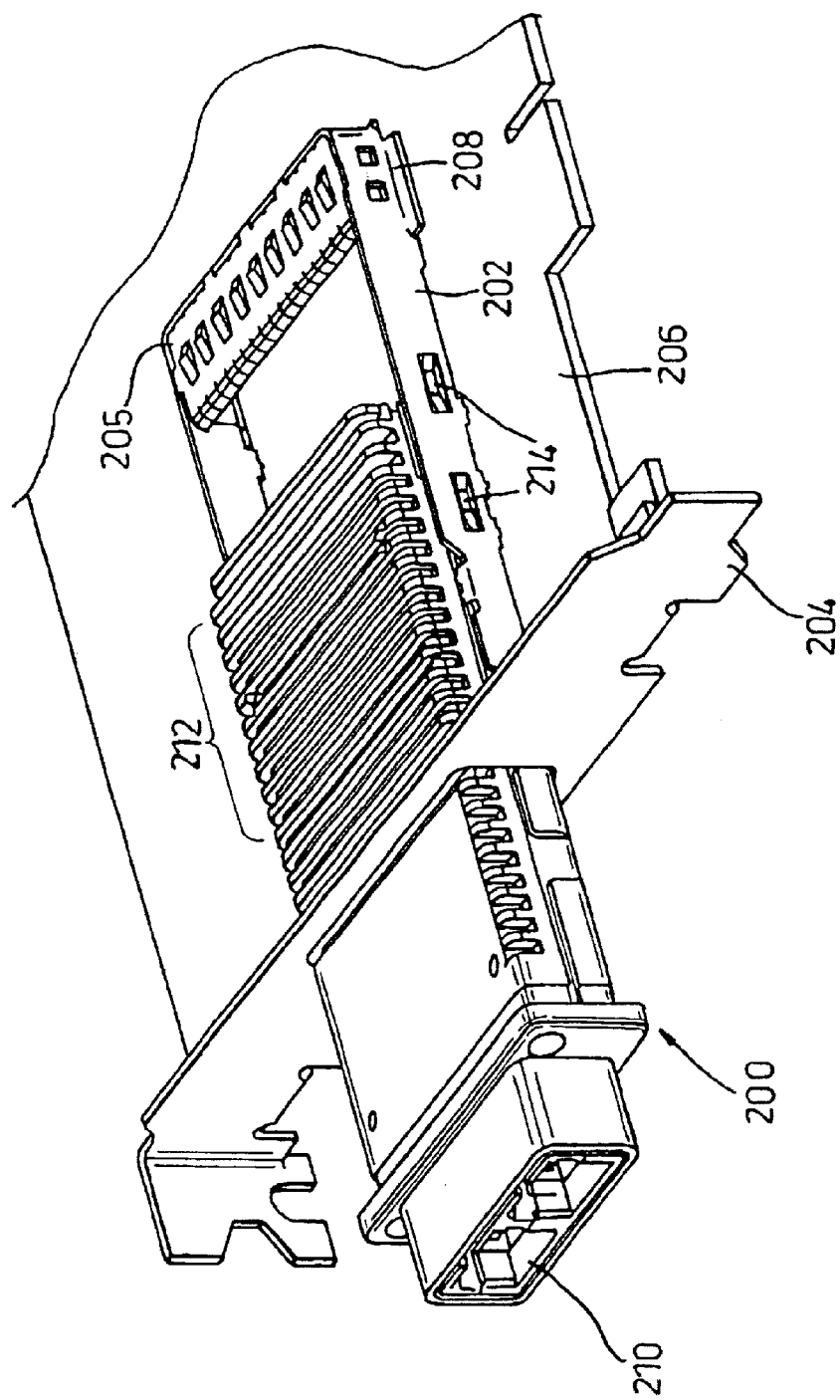
FIG. 2 is a schematic diagram of an electronic module partially inserted within a rail assembly.

Referring to FIG. 2, an electronic module, for example an opto-electronic transceiver module 200, is shown partially inserted within a rail assembly 202. The rail assembly 202 is coupled at a first end to a PCI bracket 204, the PCI bracket 204 comprising an aperture through which the module 200 is inserted to be received by the rail assembly 202. An EMI shield 205 is coupled to a second end of the rail assembly 202 and spans the width of the rail assembly 202. The rail assembly 202 is mounted upon a printed circuit board (PCB) 206 such as a motherboard which is also connected to the PCI bracket 204. The rail assembly 202 is fixed to the PCB 206 by way of a number of solder flanges 208 disposed on the outer periphery of the base of the rail assembly 202.

The module 200 is provided with an optical connector 210, for example an LC or Square Connector (SC) connector for connecting to an optical fibre (not shown in FIG. 2). A portion of the outer surface of the module 200 has a configuration for promoting efficient heat dissipation, in this example a plurality of fins 212. On insertion of the module 200 within the rail assembly 202, the module 200 is located within the rail assembly 202 by way of spring fingers 214 which act to centre the module 200 in the rail assembly 202.

Figure 3:
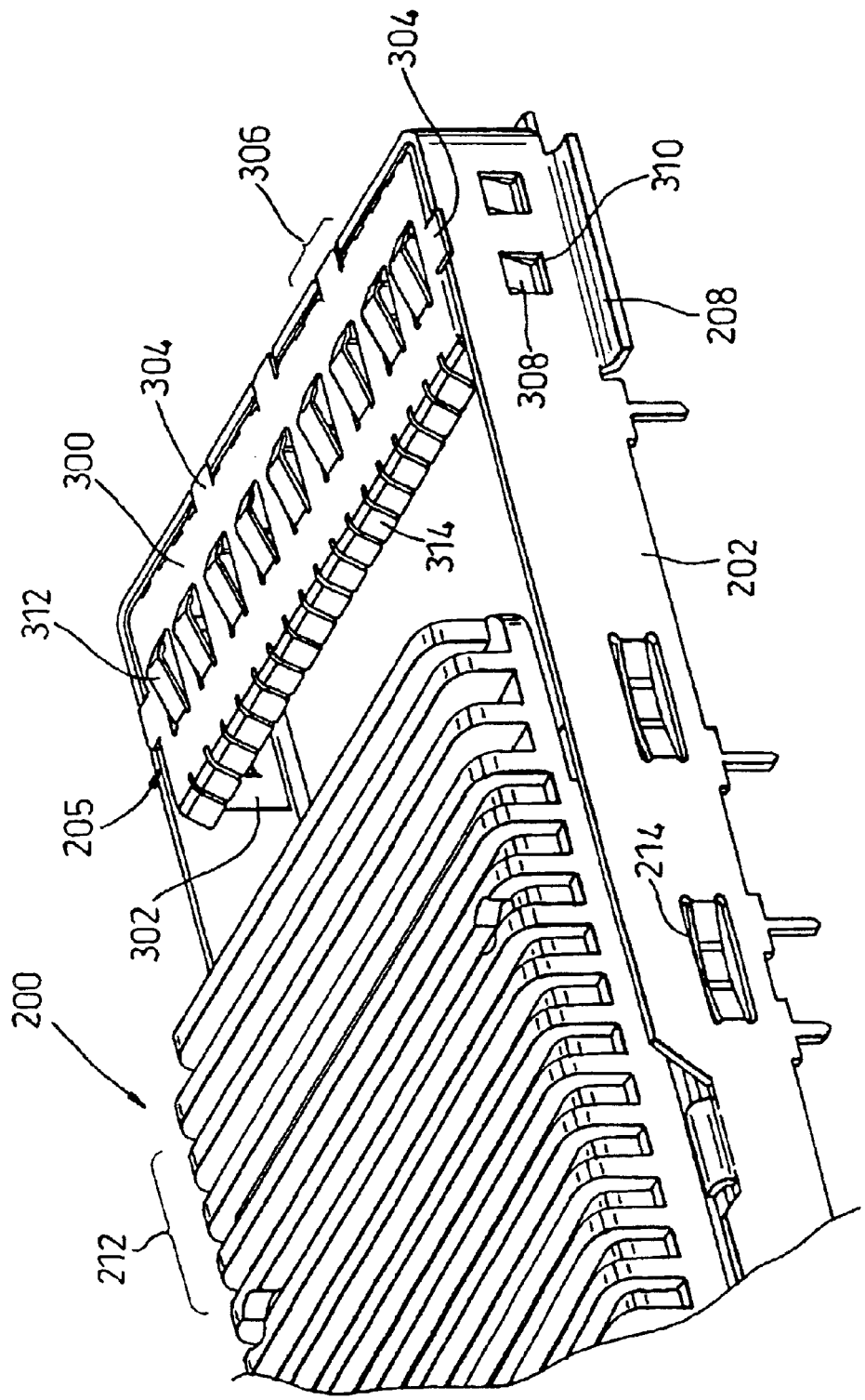
FIG. 3 is a schematic diagram of a portion of FIG. 2.

As best shown in FIG. 3, the EMI shield 205 comprises a substantially planar head portion 300 and, at its periphery, a skirt portion 302. The EMI shield 205 is located on the rail assembly 202 by way of a plurality of tabs 304 extending from the head portion 300 of the EMI shield 205 being received by a corresponding number of channels 306 formed within the rail assembly 202. Additionally, the EMI shield 205 is coupled to the rail assembly 202 by way of resilient tabs 308 extending from the skirt portion 302, of the EMI shield 205 which 'snap-fit' within retaining apertures 310, disposed in the sidewall of the rail assembly 202.

The head portion 300 of the EMI shield 205 comprises a plurality of projections or finger contacts 312, extending, or projecting, from the surface of the head portion 300. The finger contacts 312 are resiliently biased so as to firmly contact and engage the inner surface of the module 200 when the module 200 is inserted the full extent of the rail assembly 202 and therefore disposed above the EMI shield 205 and in engagement with the finger contacts 312. A channelled wall 314 runs along the length of the periphery of a free side of the EMI shield 205 substantially perpendicular to the head portion 300 of the EMI shield 205.

Figure 4:
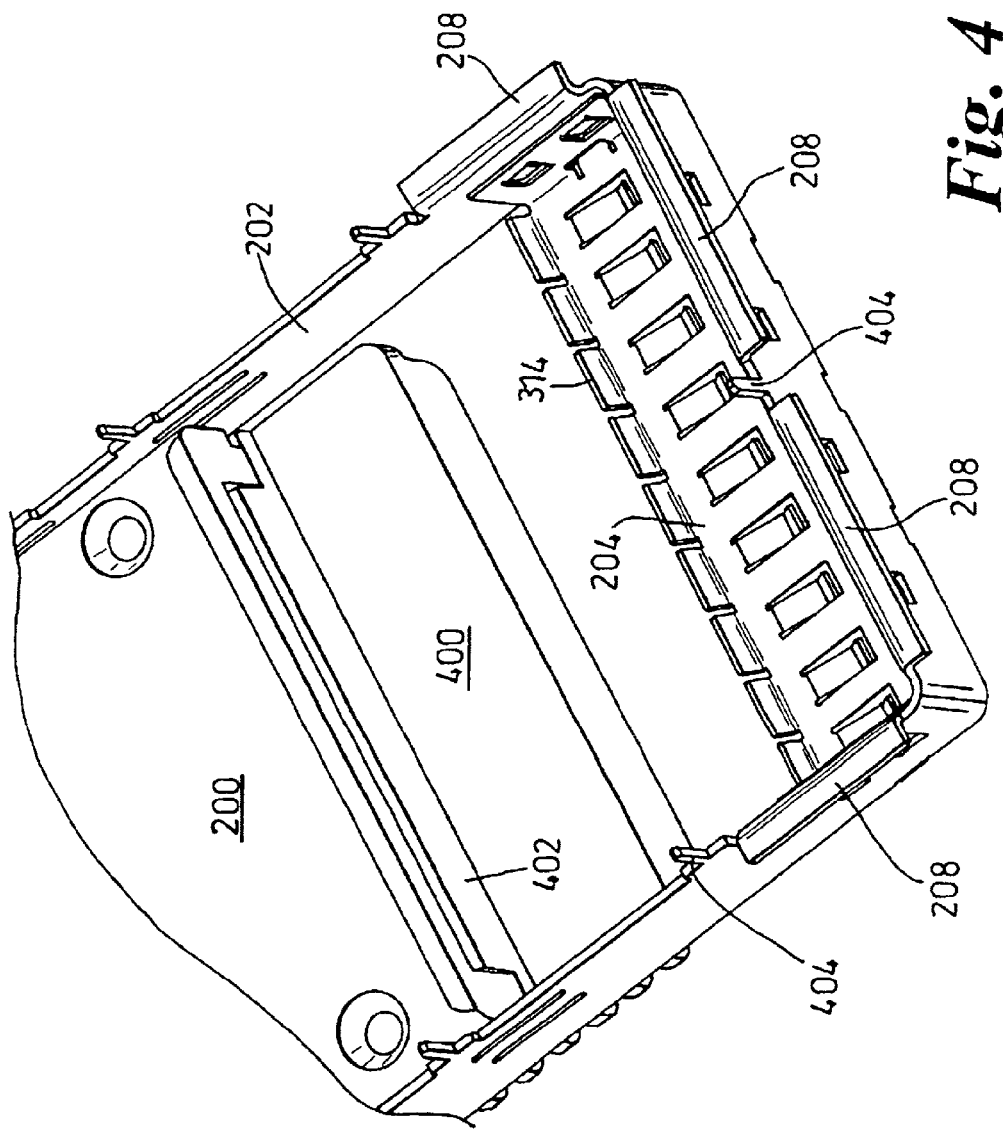
FIG. 4 is a schematic diagram of a portion of FIG. 3 from an underside perspective.

Referring to FIG. 4, an underside perspective of the arrangement of FIG. 3 best shows a lip portion 400 extending from the module 200. On full insertion of the module 200 within the rail assembly 202, the lip portion 400 of the module 200 extends over the EMI shield 205 and a wall 402 of the module 200 abuts the channelled wall 314 of the EMI shield 205. The channelled wall 314 can be resiliently biased so as to firmly engage the wall 402. As should be appreciated by the reader, on full insertion of the module 200 within the rail assembly 202, the lip portion 400 of the module 200 is disposed above and in engagement with the finger contacts 312 of the EMI shield 205, the lip portion 400 comprising the plurality of fins 212 for promoting efficient heat dissipation from this region of the module 200.

The solder flange 208 is one of four such flanges in arrangement around this portion of the periphery of the base of the rail assembly 202. A number of alignment features 404 project from the base of the rail assembly 202 which are insertable within apertures within the PCB 206.

Figure 5:
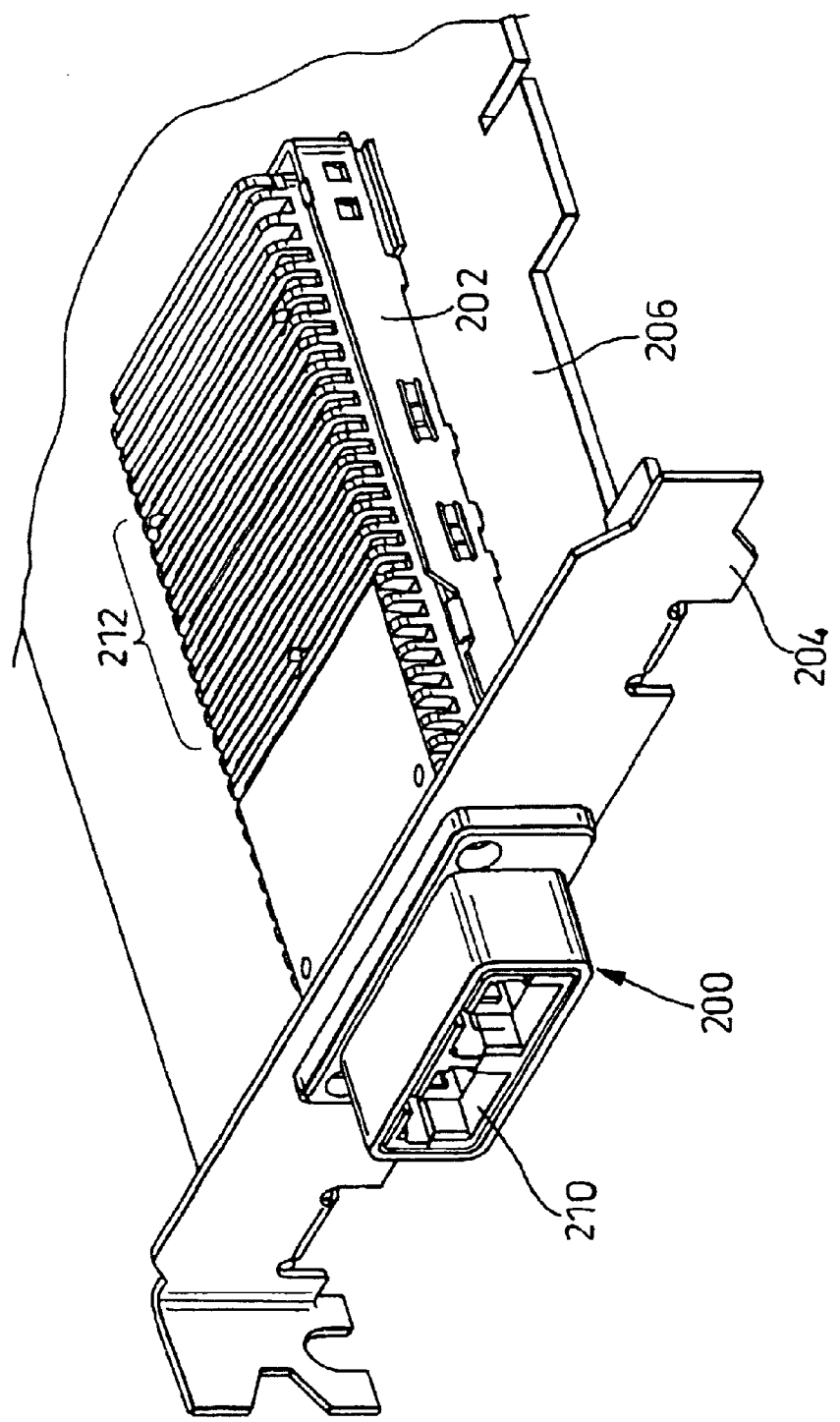
FIG. 5 is a schematic diagram of an electronic module fully inserted within a rail assembly constituting one embodiment of the present invention.
Figure 6:
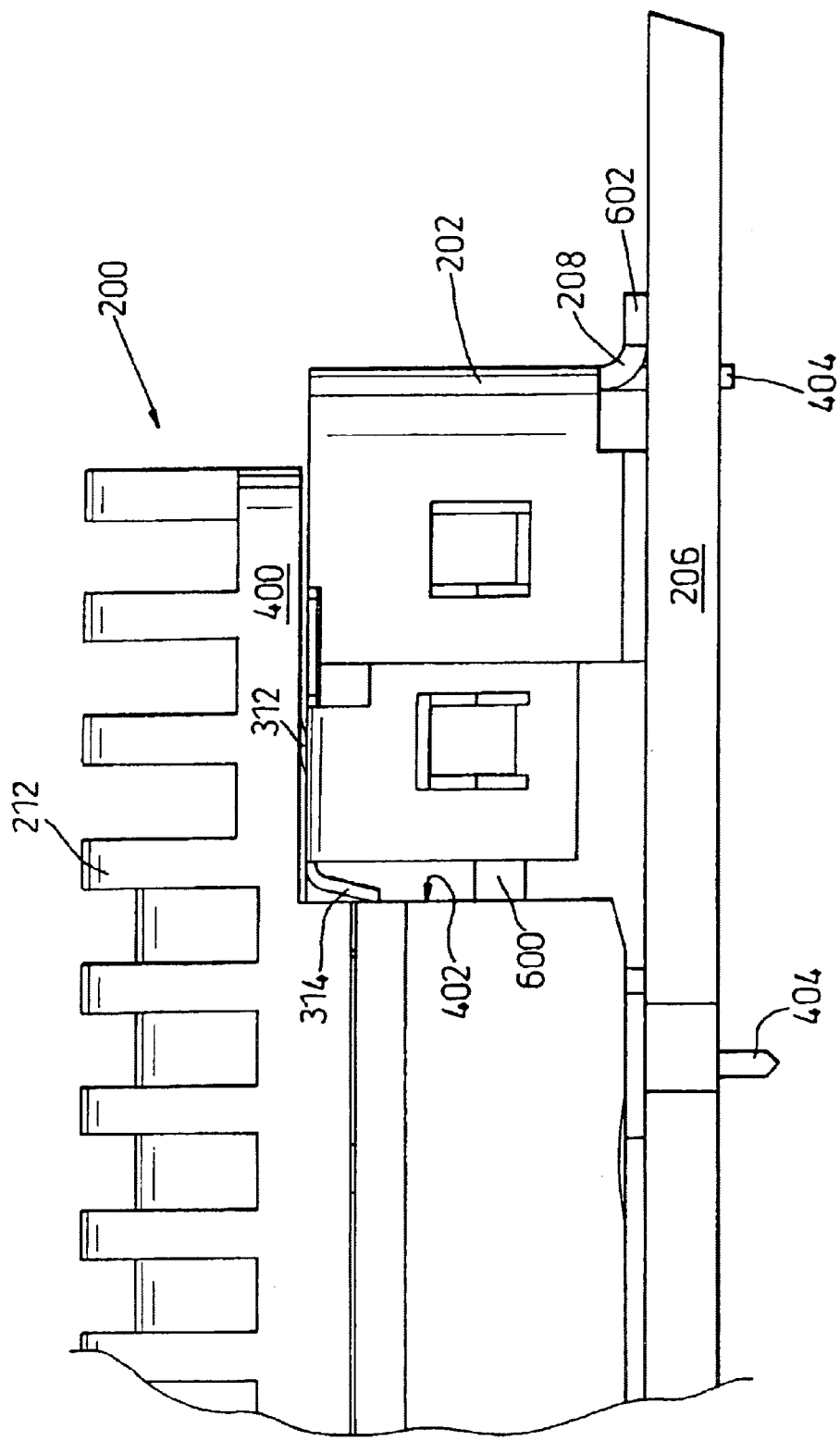
FIG. 6 is a schematic diagram of a portion of FIG. 5 from a side perspective.

Referring to FIG. 5, the module 200 is shown fully inserted within the rail assembly 202. The outer surface of the module 200 comprising the plurality of fins 212 overlays the EMI shield 205 (not shown in FIG. 5). FIG. 6 shows a side-view of the module 200 when substantially fully inserted within the rail assembly 202. For the purposes of clarity, a portion of the sidewall of the rail assembly 202 is removed so as to reveal a portion of an electronic assembly 600, for example a printed circuit board within the module 200. The EMI shield 205 is located above the electronic assembly 600. The wall 402 of the module 200 abuts the channelled wall 314 of the EMI shield 205. The resilient fingers 312 of the EMI shield 205 are in engagement with the lip portion 400 of the module 200. The solder flange 208 is coupled to the PCB 206 adjacent a contact pad 602 disposed upon the PCB 206. The alignment features 404 are inserted within apertures disposed on the PCB 206.

Figure 7:
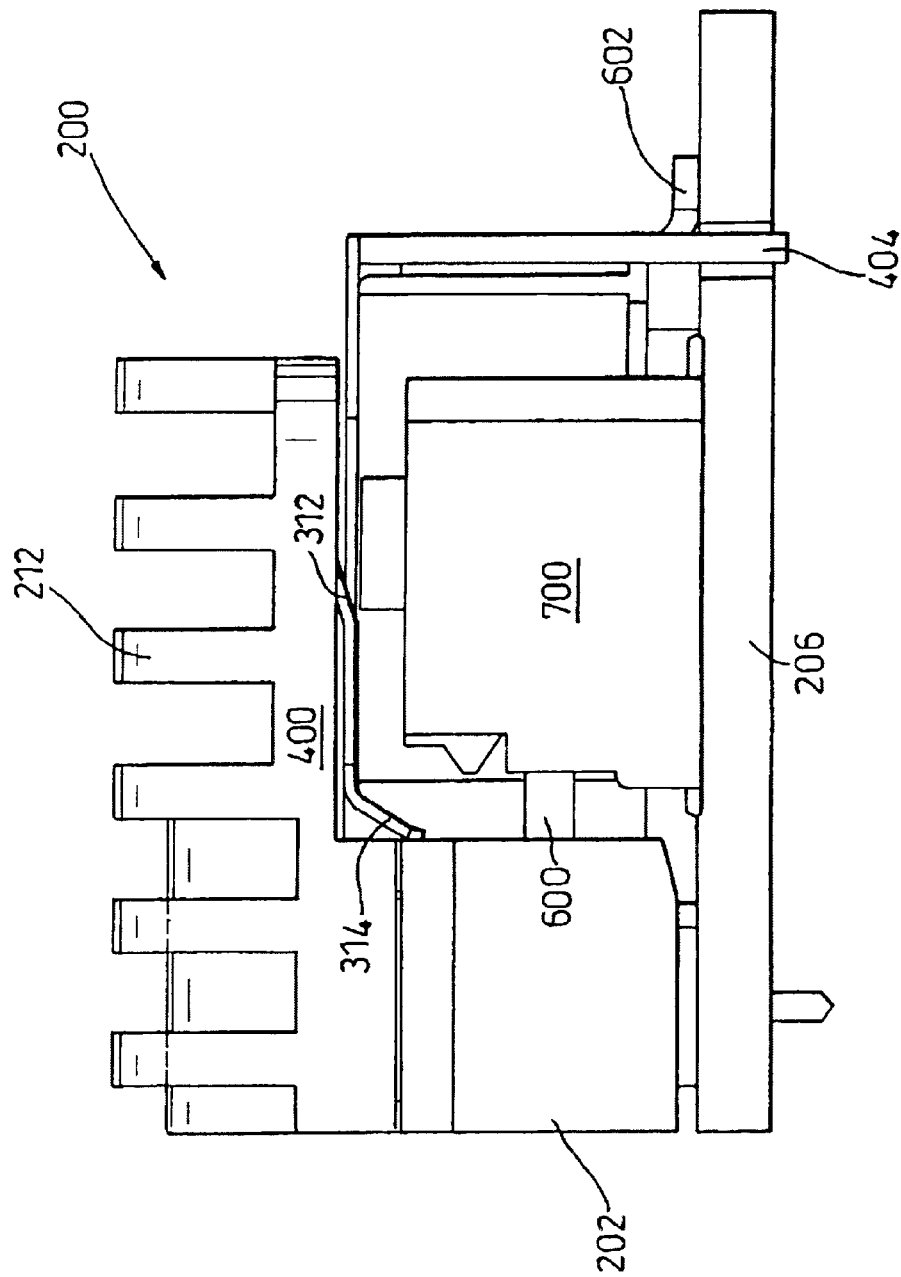
FIG. 7 is a schematic diagram of the electronic module of FIG. 5 connected to a surface mount connector from a side perspective.

Referring to FIG. 7, a side view of the module 200 is shown substantially fully inserted within the rail assembly 202. A portion of the rail assembly 202 is removed in order to reveal a surface mount connector 700. The surface mount connector 700 is disposed upon the PCB 206 and is coupled to the electronic assembly 600 of the module 200. As can be readily appreciated with reference to FIG. 7, the EMI shield 205 substantially encloses the electronic assembly 600 and the surface mount connector 700. As such, the EMI shield 205 and module 200 act as a Faraday cage around the portion of the electronic assembly 600 and the surface mount connector 700. When in use, the electronic devices within the electronic assembly 600 and the surface mount connector 700 generate EMI and heat. Together, the EMI shield 205 and the module 200 seal in any EMI emissions generated by the electronic devices so that the EMI emissions meet EMC requirements. Furthermore, as the lip portion 400 of the module 200 is positioned above the EMI shield 205, in contrast to the prior art, this region of the module 200 can be fashioned with fins 212 to promote efficient heat dissipation from this region of the module 200 and thereby prevent high temperatures being sustained within the module 200 which could lead to damage or inefficient operation of the electronic assembly 600 or surface mount connector.700.

What is claimed is:

1. An electronic module comprising:
    a housing accommodating an electronic assembly, said housing having a configuration for promoting efficient heat dissipation and said electronic assembly being connectable to an electrical connector having an EMI shield adjacent thereof;
    wherein, when said electronic assembly is connected to said electrical connector, said housing comprises a lip portion and said lip portion at least partially overlaps said EMI shield, with said housing being external of said EMI shield at said partial overlap.

2. The electronic module according to claim 1, wherein said lip portion comprises a plurality of fins.

3. A circuit board assembly comprising:
    an enclosure mounted upon a circuit board for receiving an electronic module comprising a housing accommodating an electronic assembly;
    an EMI shield disposed adjacent an electrical connector connectable to said electronic assembly, said electrical connector being disposed within said enclosure;

wherein, when said electronic assembly is connected to said electrical connector, said housing comprises a lip portion and said lip portion at least partially overlaps said EMI shield, with said housing being external of said EMI shield at said partial overlap.

4. The circuit board assembly according to claim 3, wherein said EMI shield comprises a plurality of projections trappable against said module.

5. The circuit board assembly according to claim 4, wherein said projections are resiliently biased.

6. A system comprising:

an electronic module comprising: a housing accommodating an electronic assembly, said housing having a configuration for promoting efficient heat dissipation and said electronic assembly being connectable to an electrical connector having an EMI shield adjacent thereof; wherein, when said electronic assembly is connected to said electrical connector, said housing comprises a lip portion and said lip portion at least partially overlaps said EMI shield, with said housing being external of said EMI shield at said partial overlap; and a circuit board assembly comprising: an enclosure mounted upon a circuit board for receiving said electronic module, wherein said electrical connector is disposed within said enclosure.

7. The system according to claim 6, wherein said lip portion comprises a plurality of fins.

8. The system according to claim 6, wherein said EMI shield comprises a plurality of projections trappable against said module.

9. The system according to claim 8, wherein said projections are resiliently biased.

* * * * *